United States Patent
Gerstenberger et al.

(10) Patent No.: US 6,680,956 B2
(45) Date of Patent: Jan. 20, 2004

(54) EXTERNAL FREQUENCY CONVERSION OF SURFACE-EMITTING DIODE LASERS

(75) Inventors: David C. Gerstenberger, Bothell, WA (US); Mark S. Bowers, Bothell, WA (US)

(73) Assignee: Aculight Corporation, Bothwell, WA (US)

( * ) Notice: Subject to any disclaimer, the term of this patent is extended or adjusted under 35 U.S.C. 154(b) by 170 days.

(21) Appl. No.: 10/076,794

(22) Filed: Feb. 13, 2002

(65) Prior Publication Data

US 2002/0110159 A1 Aug. 15, 2002

Related U.S. Application Data

(60) Provisional application No. 60/269,150, filed on Feb. 15, 2001.

(51) Int. Cl.[7] .................................................. H01S 3/10
(52) U.S. Cl. .......................... 372/20; 372/22; 372/45; 372/75; 372/97; 372/21
(58) Field of Search .............................. 372/20, 22, 45, 372/69, 75, 97, 21, 66, 94

(56) References Cited

U.S. PATENT DOCUMENTS

| | | | | |
|---|---|---|---|---|
| 4,578,793 A | * | 3/1986 | Kane et al. ................... | 372/94 |
| 4,747,111 A | * | 5/1988 | Trutna et al. ................. | 372/94 |
| 4,955,034 A | * | 9/1990 | Scerbak ........................ | 372/94 |
| 5,007,065 A | * | 4/1991 | Trutna, Jr. .................... | 372/94 |
| 5,052,815 A | * | 10/1991 | Nightingale et al. .......... | 372/94 |
| 5,148,444 A | * | 9/1992 | Berger .......................... | 372/94 |
| 5,177,764 A | * | 1/1993 | Nilsson ........................ | 372/94 |
| 6,167,068 A | * | 12/2000 | Caprara et al. ............... | 372/22 |
| 6,285,702 B1 | * | 9/2001 | Caprara et al. ............... | 372/92 |
| 6,370,168 B1 | * | 4/2002 | Spinelli ........................ | 372/22 |
| 6,393,038 B1 | * | 5/2002 | Raymond et al. ............. | 372/22 |
| 6,574,255 B1 | * | 6/2003 | Caprara et al. ............... | 372/45 |
| 2002/0110159 A1 | * | 8/2002 | Gerstenberger et al. ...... | 372/22 |

* cited by examiner

*Primary Examiner*—Leon Scott, Jr.
(74) *Attorney, Agent, or Firm*—Bingham McCutchen LLP; David G. Beck

(57) ABSTRACT

Methods and devices are provided for converting a fundamental wavelength of a fundamental beam generated by a surface-emitting diode laser having a first resonating cavity. According to some embodiments, a first nonlinear crystal disposed in a second resonating cavity external to first resonating cavity converts the fundamental beam to a first output beam having a first output wavelength different from the fundamental wavelength. Some embodiments include a second nonlinear crystal, which may be disposed in the second resonating cavity or in a third resonating cavity, for producing a second output beam having a second output wavelength different from the first output wavelength. In some such embodiments, the second nonlinear crystal converts the wavelength of the first output beam to produce the second output beam. In some embodiments, the second nonlinear crystal interacts with the first output beam and an infrared beam from another laser device to produce the second output beam.

25 Claims, 5 Drawing Sheets

EXTERNAL FREQUENCY CONVERSION OF SURFACE-EMITTING DIODE LASERS

CROSS-REFERENCE TO RELATED APPLICATION

This application claims priority based on U.S. Provisional Patent Application No. 60/269,150, filed Feb. 15, 2001, the disclosure of which is incorporated herein by reference for all purposes.

FIELD OF THE INVENTION

The present invention relates to laser systems and more particularly to methods and devices for nonlinear frequency conversion of continuous-wave surface emitting diode lasers.

BACKGROUND OF THE INVENTION

Diode lasers are compact and efficient sources of coherent light which are formed on semiconductor material using techniques developed for manufacturing integrated circuits. In a typical diode laser, all of the gain material and at least some of the reflective layers are formed in a single multi-layer semiconductor device.

Most diode lasers use a so-called "edge-emitter" geometry. For these lasers, the optical output is emitted from an aperture at one end of the semiconductor material. The emitter typically has a width on the order of 1 or 2 microns. The length of the emitter ranges from several microns for single-mode diode lasers to 10 millimeters or more for diode laser arrays.

Edge-emitting diode lasers have a number of drawbacks. Edge-emitting diode lasers have elliptical, divergent beams as a result of diffraction at the output aperture. Therefore, the beam must be optically corrected in order to collimate the beam over even a short distance. Moreover, the optical powers of edge-emitting diode lasers are often limited by the onset of catastrophic optical damage (COD) at the output aperture.

A significant amount of activity has recently been devoted to the development of "surface-emitting" diode lasers. For these devices, the optical output is emitted from the larger top or bottom surface of the semiconductor material. Consequently, the emitter aperture can be much larger than from an edge-emitter and much higher powers can be produced before reaching the onset of COD. In addition, a surface-emitting diode laser provides a circular beam which is less divergent than those produced by edge-emitting diode lasers.

In one common type of surface-emitting diode laser known as a vertical external cavity surface-emitting laser (VECSEL), multiple layers of distributed Bragg reflectors (DBRs) within the semiconductor material are used to form one end of a resonating cavity and a mirror, separate from the semiconductor material, forms the other end of the resonating cavity. To couple the larger surface-emitting gain region efficiently with a low order optical mode, the separate mirror is situated above the surface-emitter. Although the resonating cavity formed by the DBRs and the external mirror is commonly referred to as an "external" cavity, it will be referred to herein as a type of internal cavity.

The gain region of a surface-emitting diode laser typically has a thickness of only a few microns, which is only a few wavelengths of the emitted light. Consequently, the fundamental beam must pass through the gain material many times in order to develop a sufficiently high amplitude required by many applications. Therefore, both ends of the resonating cavity must be highly reflective for the desired output wavelength.

The output from most diode lasers, including VECSELs, is confined primarily to the near infrared portion of the spectrum. However, many applications require wavelengths in the visible or ultraviolet spectral region. The infrared output of diode lasers can be converted to the visible or ultraviolet by nonlinear optical frequency conversion such as optical frequency doubling.

The infrared outputs of VECSELs have been converted to the visible using intra-cavity frequency doubling. This approach involves inserting a nonlinear crystal directly into the resonator of the VECSEL, i.e., between the gain portion of the VECSEL and the outside mirror which forms one end of the VECSEL's resonating cavity.

Intra-cavity frequency doubling with low-gain lasers such as VECSELs is problematic. Optical losses associated with the introduction of nonlinear optical crystals into the VECSEL resonator increase the threshold for the VECSEL, reducing efficiency. In addition, a portion of the infrared optical power circulating inside the VECSEL resonator is converted to the second harmonic in each direction. The second harmonic that is generated as the infrared beam travels from the gain region toward the external mirror can be out-coupled. However, the second harmonic generated in the nonlinear crystal as the infrared beam returns from the external mirror toward the semiconductor gain structure is also directed toward the semiconductor structure, where it is absorbed or de-phased relative to the infrared beam. Hence, this portion of the second harmonic light is lost and the nonlinear conversion efficiency is reduced by 50% or more.

SUMMARY OF THE INVENTION

The present invention provides devices and methods for efficiently converting the fundamental frequencies of surface-emitting diode lasers.

One aspect of the present invention provides a method of operating a solid state laser apparatus, including the steps of: pumping a surface-emitting diode laser to output a fundamental beam having a fundamental wavelength, the surface-emitting diode laser having a first resonating cavity; disposing a first nonlinear crystal in a second resonating cavity external to the first resonating cavity; directing the fundamental beam into the first nonlinear crystal; and tuning the first nonlinear crystal to generate a first output beam resulting from the interaction of the fundamental beam with the first nonlinear crystal, the first output beam having a first output wavelength different from the fundamental wavelength.

The first output beam may be directed into a second nonlinear crystal tuned to generate a second output beam having a wavelength different from the first output wavelength. The second nonlinear crystal may be disposed in a third resonating cavity external to the second resonating cavity. The second nonlinear crystal may be disposed in the second resonating cavity.

Some such methods include the steps of pumping an infrared laser to output an infrared beam, directing the infrared beam into the second nonlinear crystal and generating the second output beam by interaction of the infrared beam and the first output beam with the second nonlinear crystal.

According to another aspect of the present invention, a method of operating a solid state laser apparatus includes the steps of: pumping a surface-emitting diode laser to output a fundamental beam having a fundamental wavelength, the surface-emitting diode laser including a first resonating cavity; configuring a first surface and a second surface of a nonlinear crystal for total internal reflection to form portions of a second resonating cavity outside of the first resonating cavity; directing the fundamental beam into the nonlinear crystal; and tuning the nonlinear crystal to generate an output beam resulting from the interaction of the fundamental beam with the nonlinear crystal, the output beam having an output wavelength different from the fundamental wavelength.

According to some embodiments of the present invention, a laser apparatus includes: a surface-emitting diode laser including a first resonator; a pump for pumping the surface-emitting diode laser means to output a fundamental beam having a fundamental wavelength; a first nonlinear crystal for converting the fundamental beam to a first output beam having a first output wavelength different from the fundamental wavelength; a second resonator within which the first nonlinear crystal is disposed, the second resonator external to the first resonator; and an optical device for directing the fundamental beam into the first nonlinear crystal.

Some such embodiments include a second nonlinear crystal disposed within a third resonator external to the second resonator means for generating a second output beam having a wavelength different from the first output beam. Some embodiments include an infrared laser for outputting an infrared laser beam and an optical device for directing the infrared laser beam into the second frequency conversion means, wherein the second frequency conversion means generates the second output beam by interaction of the infrared beam and the first output beam with the second nonlinear crystal means.

Still other embodiments of the present invention provide a laser device including: a surface-emitting diode laser which outputs a fundamental beam having a fundamental wavelength, the surface-emitting diode laser comprising a first resonating cavity; a nonlinear crystal comprising a first surface and a second surface configured to form portions of a second resonating cavity disposed outside of the first resonating cavity; an optical device for directing the fundamental beam into the nonlinear crystal; and an adjustable mount for angle-tuning the nonlinear crystal to generate an output beam resulting from the interaction of the fundamental beam with the nonlinear crystal, the output beam having an output wavelength different from the fundamental wavelength.

DESCRIPTION OF THE SPECIFIC EMBODIMENTS

Figure 1:
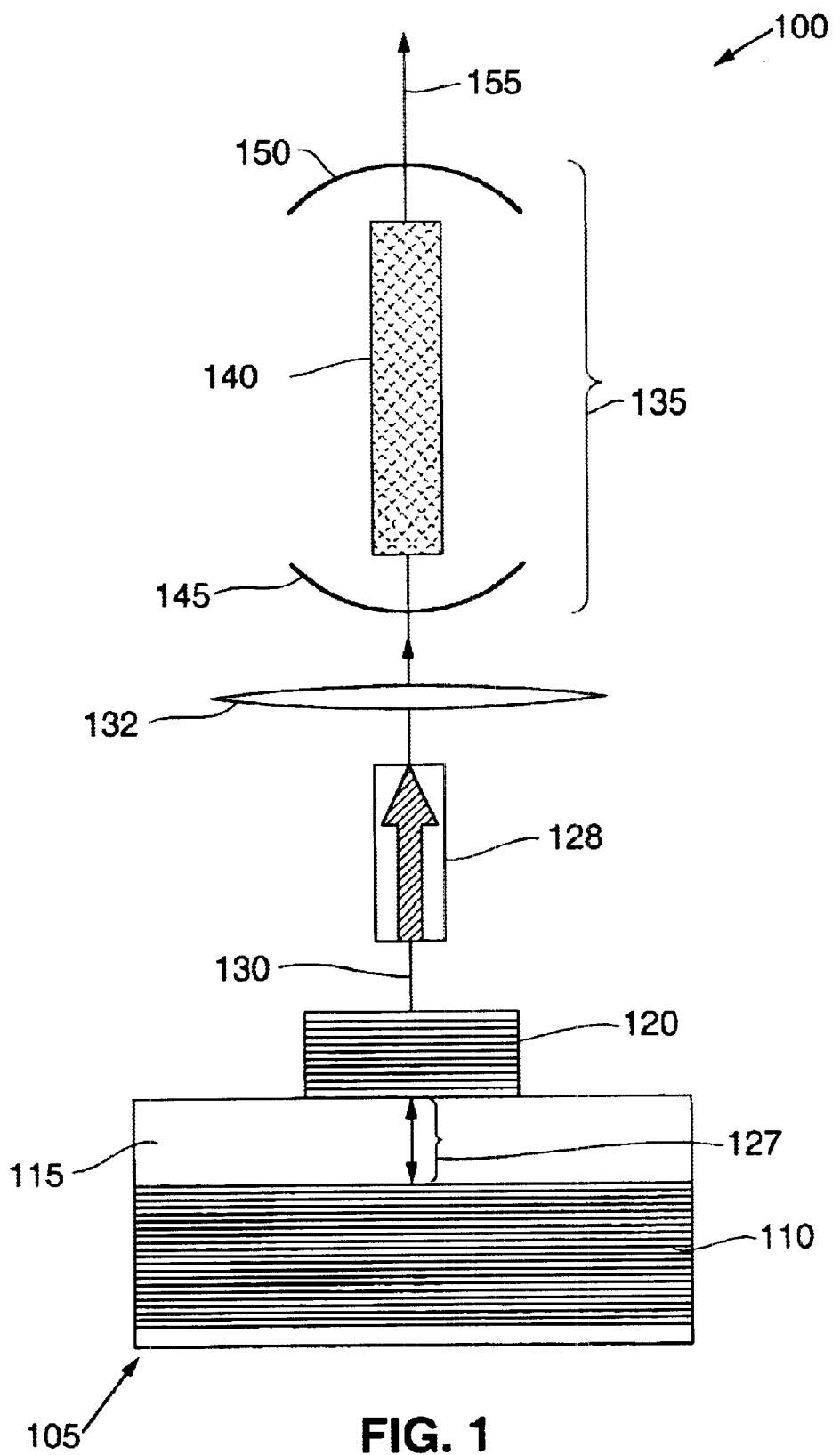
FIG. 1 illustrates one embodiment of a laser device according to the present invention.

A variety of devices are described for efficiently converting the wavelength of a fundamental beam generated by a surface-emitting diode laser. Broadly speaking, the present invention involves the use of one or more external resonating cavities for generating wavelengths different from that of the fundamental beam. In general, a single nonlinear crystal is disposed in each external cavity. However, in some preferred embodiments, one or more surfaces of a nonlinear crystal are configured to be reflective and to form part of an external resonating cavity.

Some devices according to the present invention include a non-linear crystal disposed in one or more external cavities for outputting harmonics of the fundamental beam by sum-frequency mixing, for example by frequency doubling. Some of the external cavities have a linear configuration and some have a ring configuration.

Certain embodiments of the present invention include a non-linear crystal disposed in one or more external cavities for mixing a fundamental beam output by the surface-emitting diode laser with a beam from one or more other lasers. In some such embodiments, a non-linear crystal is disposed in an external cavity for mixing the fundamental beam with a pump beam.

The present invention includes embodiments which have at least two external cavities, each of which contains a nonlinear crystal. In some such embodiments, the nonlinear crystal in the second external cavity converts the wavelength of a first output beam from the first external cavity to produce a second output beam. Other embodiments include an infrared laser which outputs an infrared beam. In some such embodiments, the second nonlinear crystal interacts with the infrared beam and the first output beam to produce the second output beam.

Some advantages of the present invention may be understood after consideration of the fundamental relationships between the power of an input beam and the power developed in a resonating cavity which resonates the input beam. The optical power, $P_c$, that can be established in a linear external optical resonator defined by an input coupler mirror and a high reflector mirror is given by the following expression:

$$P_c/P_1 = (1-r_1)/[1-(r_1 r_m)^{1/2}]^2 \qquad \text{Equation (1)}$$

In Equation 1, $P_1$ is the power incident on the cavity (for example, the power of a beam output by a surface-emitting diode laser and directed to the cavity), $r_1$ is the reflectivity of the input coupler mirror, and $r_m$ is the effective reflectivity of the cavity mirrors and all elements within the cavity (not including the reflectivity of the input coupler mirror).

Another fundamental relationship is expressed below:

$$r_m = r_2 T(1 - \Gamma P_c) \qquad \text{Equation (2)}$$

In Equation (2), T is the round trip transmission of a nonlinear crystal disposed in the cavity, $r_2$ is the reflectivity of the high reflector mirror and $\Gamma$ is the nonlinear conversion coefficient of the nonlinear crystal.

By choosing $r_1 = r_m$, Equation (1) can be simplified to show that the ratio of circulating power to incident power, $P_c/P_1$, is $1/(1-r_1)$.

One important ramification of Equation (1) is that for a low loss resonator, the circulating power can be much larger than the incident power. Another important fact is that $P_c$ can be higher than $P_r$, the optical power circulating inside the resonator which generates the incident beam.

In some illustrative configurations, the nonlinear crystal in the external cavity is tuned to generate a second harmonic of an input beam generated by a surface-emitting diode laser.

The second harmonic power generated in the external cavity is Γ times $P_c^2$. Because $P_c$ can be higher than the optical power circulating in the resonator of the surface-emitting diode laser, the second harmonic power generated using extra-cavity frequency doubling can be higher than the power generated using intra-cavity frequency doubling.

As mentioned above, the trend of the prior art has been to place a nonlinear crystal inside the internal cavity of a surface-emitting diode laser for frequency conversion. Instead of following this trend, the present inventors have developed methods and devices for frequency conversion which take Equation (1) and Equation (2) into account, particularly the aspect of being able to develop higher power in an external cavity.

FIG. 1, which is not drawn to scale, illustrates one such embodiment of laser device 100 according to the present invention. In summary, fundamental beam 130 is emitted from surface-emitting diode laser 105 and is frequency-doubled in external resonator 135 to produce output beam 155.

Surface-emitting diode laser 105 includes reflective layers 110, gain medium 115 and reflective layers 120. Reflective layers 110 and 120 must be highly reflective in order for surface-emitting diode laser 105 to be efficient. In preferred embodiments, reflective layers 110 and 120 are DBRS, formed by depositing alternating layers of semiconductor or dielectric material having a difference in refractive index, in a manner known to those of skill in the art. Preferably, reflective layers 110 and 120 are either p-doped or n-doped, so that active medium 115 may be electrically pumped by applying a voltage between reflective layers 110 and 120.

In one such embodiment, reflective layers 110 are n-doped and formed of 40 alternating layers of $Al_xGa_{(1-x)}$ and AlAs. Reflective layers 120 are p-doped and formed of 25 alternating layers of $Al_xGa_{(1-x)}$ and AlAs. Each layer of reflective layers 110 and 120 has a thickness of approximately ¼ of the desired output wavelength. In this embodiment, reflective layers 110 have a reflectivity in excess of 99.99% and reflective layers 120 have a reflectivity of approximately 99.9%. Despite this high reflectivity, reflective layers 120 are about an order of magnitude less reflective than reflective layers 110 and act as an output coupler for surface-emitting diode laser 105. In other embodiments, reflective layers 110 and 120 are formed of other materials, such as AlGaAs/GaAs or GaAs/AlAs and have other reflectivity values.

Active medium 115 may be composed of any convenient active medium known in the art. In one embodiment, active medium 115 is formed of InGaAsP-InP. Active medium 115 may be formed in a variety of thicknesses, but generally has a thickness of no more than a few wavelengths of the desired fundamental beam.

Beam 125 resonates inside internal resonating cavity 127, defined by reflective layers 110 and 120, and develops optical power Pr. Fundamental beam 130 is emitted from surface-emitting diode laser 105 and is directed through optical isolator 128 and lens 132 to external resonator 135 for conversion to the frequency of output beam 155.

Optical isolator 128 prevents light reflected from lens 132 or external resonator 135 from re-entering surface-emitting diode laser 105. Optical isolator 128 is an important element for embodiments of laser device 100 which include linear resonators, such as the one depicted in FIG. 1, but is not always required for other configurations of external resonator 135. For example, optical isolator 128 is not always required when external resonator 135 is a ring resonator.

In some embodiments, optical isolator 128 includes a first polarizer, Faraday material and a second polarizer. The first polarizer linearly polarizes fundamental beam 130 as it travels toward lens 132, the Faraday material rotates the polarization angle of fundamental beam 130 by 45 degrees and the second polarizer passes the rotated beam. Reflected light is rotated another 45 degrees in the same direction by the Faraday material. Therefore, such reflected light does not pass back through the first polarizer because it is polarized at 90 degrees to the polarizing angle of the first polarizer.

However, optical isolator 128 may be configured in any convenient fashion. In some embodiments, optical isolator 128 is an optical circulator of a kind known to those of skill in the art. In some embodiments, optical isolator 128 is disposed between lens 132 and external resonator 135.

Nonlinear crystal 140 is disposed within external resonator 135, formed by input mirror 145 and output mirror 150. In some preferred embodiments, nonlinear crystal 140 is formed of periodically-poled potassium titanyl phosphate (PPKTP). In one such embodiment, nonlinear crystal 125 is formed of PPKTP with a thickness of 1 millimeter, a width of 5 millimeters and a length of 10 millimeters. One vendor for such PPKTP crystals is Cobalt AB of Stockholm, Sweden. However, nonlinear crystal 125 may be formed in a variety of dimensions. Some preferred embodiments of nonlinear crystal 125 include anti-reflective (AR) coatings for the wavelengths of fundamental beam 130 and output beam 155.

In other embodiments, materials for nonlinear crystal 125 include, but are not limited to, lithium niobate, lithium triborate (LBO), potassium titanyl phosphate, β-barium borate, cesium lithium borate (CLBO), periodic-poled lithium niobate, potassium niobate, potassium titanyl phosphate, rubidium titanyl phosphate, cesium titanyl phosphate, potassium titanyl arsenate and rubidium titanyl arsenate.

When nonlinear crystal 140 is formed of PPKTP, optimum focusing into nonlinear crystal 140 occurs when lens 132 is configured for confocal focusing. Looser focusing (over a larger area) reduces optical damage in nonlinear crystal 140, but with reduced nonlinear conversion efficiency.

In some embodiments, $P_{cl}$, the power of the beam circulating inside external resonator 135, is greater than $P_r$, the power of the beam circulating inside internal resonating cavity 127.

Second harmonic output beam 155 can be separated from fundamental beam 130 by using dichroic mirrors, optical absorption filters, prisms, or similar devices. In one embodiment of laser device 100, mirror 145 has a reflectivity defined by Equation (2) for the wavelength of fundamental beam 130 and is highly reflective for the wavelength of output beam 155, and mirror 150 is reflective for the wavelength of fundamental beam 130 and is highly transmissive for the wavelength of output beam 155.

Although FIG. 1 depicts a simplified version of external resonator 135, external resonator 135 may be configured in any way known in the art. For example, in some embodiments external resonator 135 has a ring configuration, wherein all of the frequency-converted light is generated in the same direction. Other configurations of external resonator 135 will be discussed in detail below with reference to FIG. 3.

Figure 2:
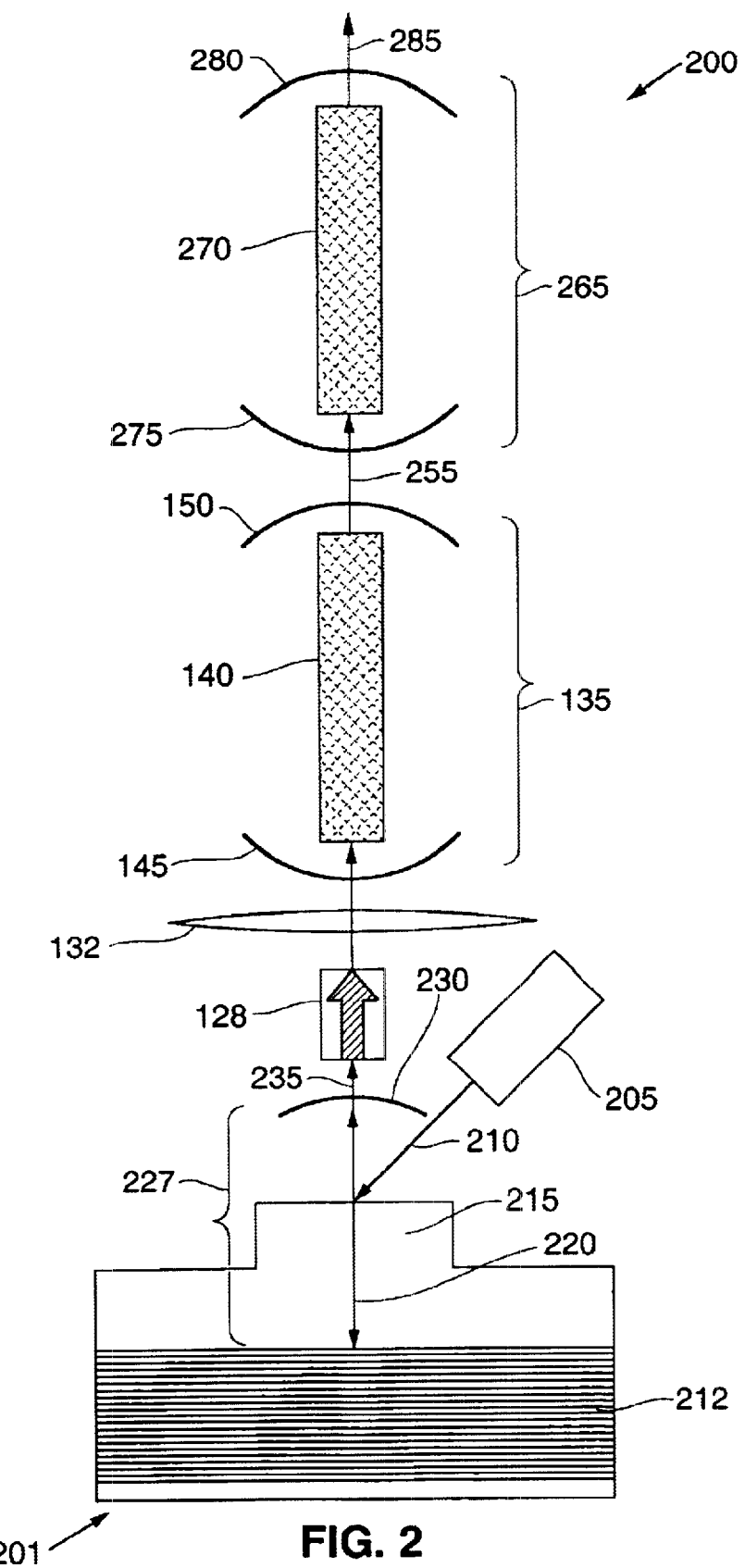
FIG. 2 illustrates a second embodiment of a laser device according to the present invention.

FIG. 2 illustrates laser device 200 according to the present invention. Laser 205 emits pump beam 210 to pump active medium 215 of surface-emitting diode laser 201. Laser 205 may be any convenient pump laser. In some embodiments, laser 205 is a diode laser. Laser 205 emits pump beam 210 at any convenient wavelength for pumping active medium 215, as known by those of skill in the art. In some embodiments, pump beam 210 has a wavelength of approximately 980 nanometers. In other embodiments, pump beam 210 has a wavelength of approximately 800 nanometers.

Active medium 215 may be composed of any convenient gain material, such as the material used to form previously-described active medium 115. When pump beam 210 has a wavelength of 800 nanometers, active medium 215 emits fundamental beam 235 at approximately 980 nanometers. When pump beam 210 has a wavelength of 980 nanometers, active medium 215 emits fundamental beam 235 at approximately 1300 nanometers.

Resonating beam 220 resonates within internal cavity 227, defined by reflective layers 212 and external mirror 230, and develops optical power Pr. Reflective layers 212, like reflective layers 110 and 120, are preferably DBRs. Mirror 230 is an output coupler and has a reflectivity of roughly 99%. This reflectivity varies in different embodiments and is chosen to maximize power in fundamental beam 235.

As described with reference to FIG. 1, fundamental beam 235 is directed through optical isolator 128 to lens 132. Lens 132 focuses fundamental beam 235 into nonlinear crystal 140, which is disposed within external resonator 135. In one embodiment of laser device 200, mirror 145 has a reflectivity defined by Equation (2) for the wavelength of fundamental beam 235 and is highly reflective for the wavelength of first output beam 255, and mirror 150 is reflective for the wavelength of fundamental beam 235 and is highly transmissive for the wavelength of first output beam 255.

In one embodiment, fundamental beam 235 has a wavelength of approximately 980 nanometers and is frequency-doubled by nonlinear crystal 140 to produce first output beam 255 at a wavelength of approximately 490 nanometers.

First output beam 255 is directed to nonlinear crystal 270, which is located inside external resonator 265. Nonlinear crystal 270 converts the wavelength of first output beam 255 to that of second output beam 285. In one embodiment of laser device 200, mirror 275 has a reflectivity defined for Equation (2) for the wavelength of first output beam 255 and is highly reflective for the wavelength of second output beam 285, and mirror 280 is reflective for the wavelength of first output beam 255 and is highly transmissive for the wavelength of second output beam 285.

In one such embodiment, first output beam 255 has a wavelength of approximately 490 nanometers and second output beam 285 has a wavelength of approximately 245 nanometers. In this embodiment, mirror 275 has a reflectivity defined by Equation (2) for 490 nanometer light and is highly reflective for 245 nanometer light, and mirror 280 is reflective for 490 nanometer light and is highly transmissive for 245 nanometer light.

Suitable materials for nonlinear crystal 270 include, but are not limited to, potassium dihydrogen phosphate, deuterated potassium dihydrogen phosphate, ammonium dihydrogen phosphate, β-barium borate and CLBO. Many embodiments of the present invention include devices known in the art for angle-tuning or temperature-tuning at least one of nonlinear crystals 140 and 270. In most embodiments of the present invention, nonlinear crystals 140 and 270 are configured to reduce the wavelength of output beams. However, in some embodiments, at least one of nonlinear crystals 140 and 270 is configured to perform as an optical parametric oscillator, providing one or more output beams at a wavelength longer than that of the input beam.

Although laser device 200 is shown with 2 external cavities and laser device 100 is shown with 1 external cavity, either device could have any convenient number of external cavities.

According to some embodiments of the present invention, external resonator 265 is used to generate second output beam 285 by sum-frequency mixing. In some embodiments, first output beam 255 is mixed with the output of a second laser (not shown), which may be a second surface-emitting diode laser. In some such embodiments, first output beam 255 is mixed with the infrared output of a second surface-emitting laser (not shown) to produce second output beam 285 as a third harmonic of fundamental beam 235.

Although FIG. 2 depicts a simplified version of external resonator 265, external resonator 265 may be configured in any way known in the art. For example, in some embodiments external resonator 265 has a ring configuration, wherein all of the frequency-converted light is generated in the same direction. Other configurations of external resonator 265 will be discussed in detail below with reference to FIG. 3.

Figure 3:
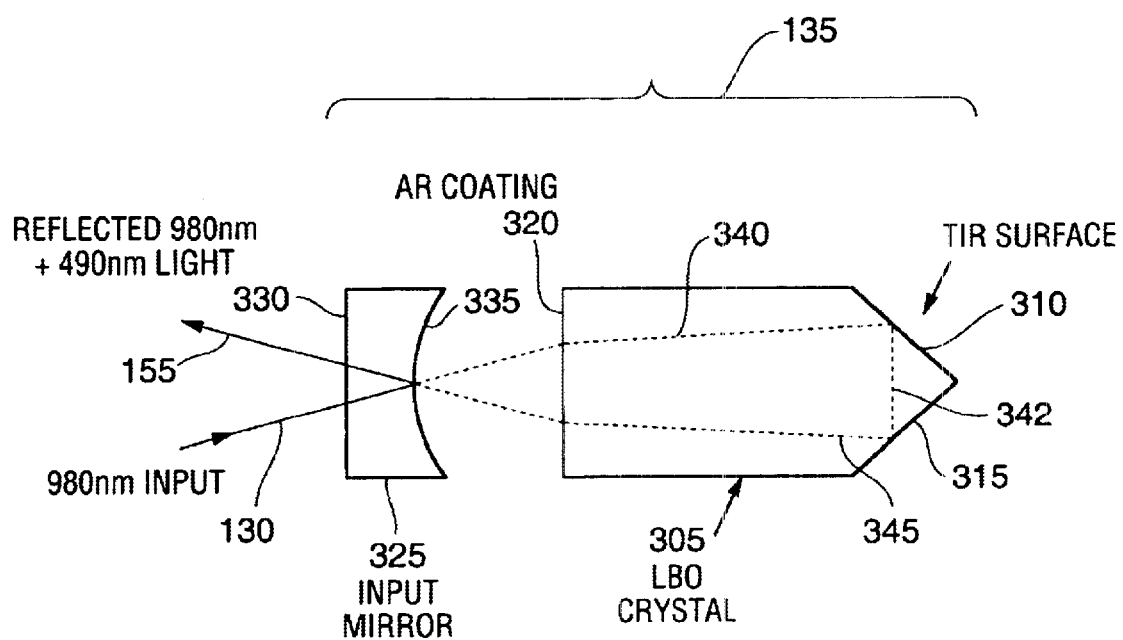
FIG. 3 depicts an external resonant cavity formed in part by total internal reflection from two surfaces of a nonlinear crystal.

FIG. 3 illustrates a configuration for external resonator 135 according to one aspect of the present invention. External resonator 135 includes nonlinear crystal 305 and mirror 325.

Nonlinear crystal 305 may be formed of the same materials described above with respect to nonlinear crystals 140 and 270. In one preferred embodiment, nonlinear crystal 305 is formed of LBO. Nonlinear crystal 305 is fabricated to provide reflective surfaces 310 and 315 and entrance face 320. In one embodiment, nonlinear crystal 305 is an LBO crystal having a length of 7 millimeters and a 3 millimeter by 3 millimeter cross-section.

In some preferred embodiments, reflective surface 310 is configured to produce total-internal-reflection (TIR) of leg 340 and reflective surface 315 is configured to produce TIR of leg 342. TIR occurs at the interface of a dielectric material (refractive index=n) and air when the angle of incidence of light traveling in the dielectric is greater than the critical angle, $\theta_c$, such that:

$$\theta_c \geq \sin^{-1}(1/n) \qquad \text{Equation (3)}$$

For LBO, n equals approximately 1.7 and $\theta_c$ equals approximately 36°.

In some embodiments, a reflective coating is formed on at least one of reflective surfaces 310 and 315.

Entrance face 320 is anti-reflection (AR) coated at the wavelengths of fundamental beam 130 and output beam 155. In the embodiment depicted in FIG. 3, entrance face 320 is AR coated for 980 nanometer light and 490 nanometer light.

External resonator 135 is completed by mirror 325, which is configured to be both an input and an output mirror. In some preferred embodiments, mirror 325 has curved side 335 facing towards nonlinear crystal 305 and flat side 330 facing away from nonlinear crystal 305. The curvature of curved side 335 is selected to provide optimum mode size in nonlinear crystal 305 for nonlinear conversion. The optimum mode size in nonlinear crystal 305 corresponds to approximately confocal focusing in nonlinear crystal 305, as is well-known by those skilled in the art. The curvature of side 335, combined with the optical path length of resonator 135, define the optical mode of resonator 135.

The reflectivity of the coatings on mirror 325 is selected using Equations (1) and (2) to optimize the production of the desired output, e.g., second harmonic output. Coating mirror 325 for reflectivity from about 98% to about 95% at 980 nanometers provides satisfactory performance for a wide range of nonlinear materials, power levels, and optical qualities.

Mirror 325 and reflective surfaces 310 and 315 define a triangular beam path within external resonator 135. In some preferred embodiments, one of legs 340 and 345 is oriented to phase-match and generate the second harmonic of the fundamental beam. The mirror is preferably mounted on a positioner, such as a piezo-electric positioner, to adjust the optical length of the optical resonator and maximize optical coupling of fundamental beam 130 into external resonator 135.

Figure 4:
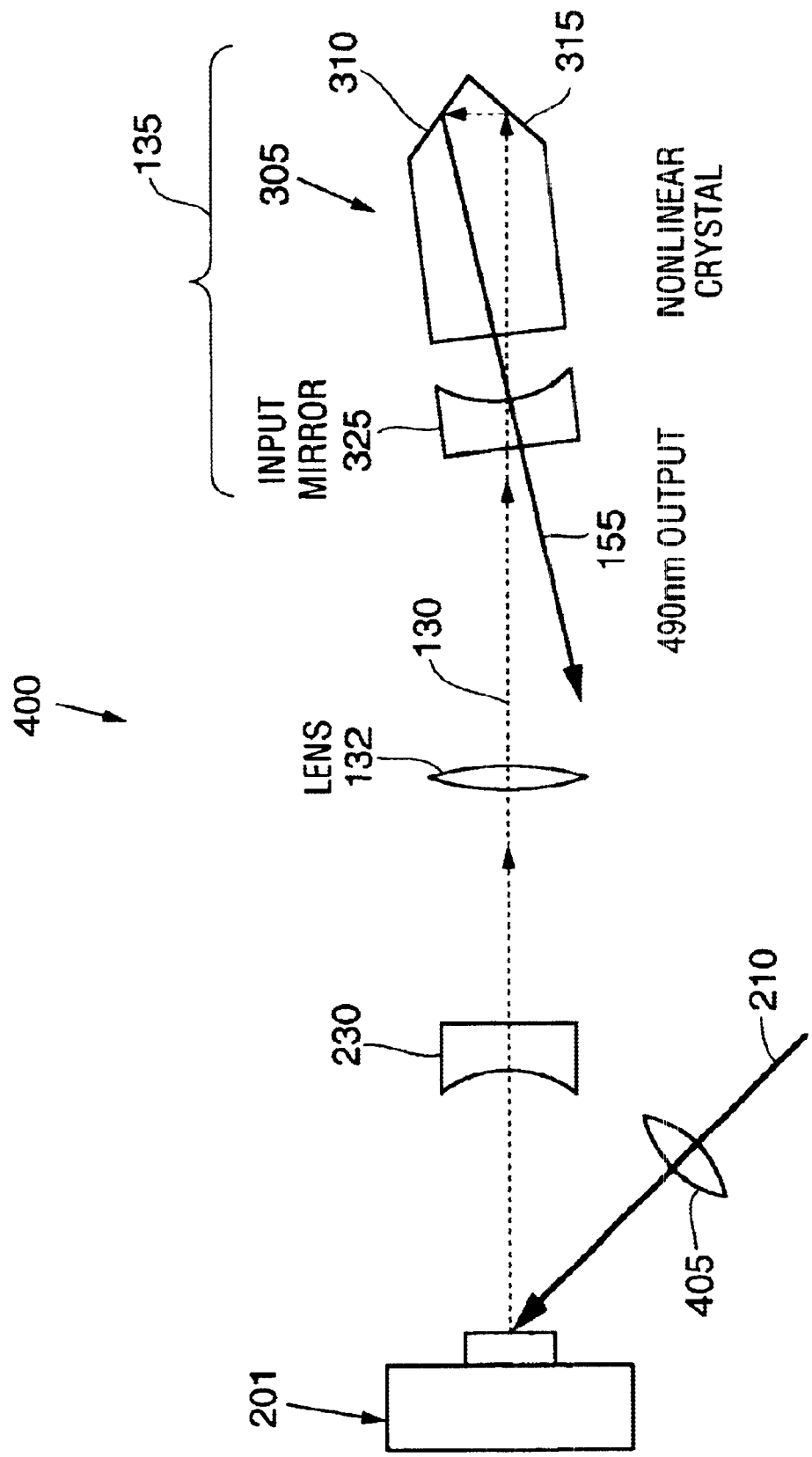
FIG. 4 illustrates the external resonant cavity of FIG. 3 used to convert the output wavelength of a fundamental beam emitted by a VECSEL.

FIG. 4 shows an embodiment of laser device 400 according to the present invention. In FIG. 4, pump beam 210 is focused by lens 405 to pump surface-emitting diode laser 210, which emits fundamental beam 130. Fundamental beam 130 is optically coupled into external resonator 135 by lens 132, wherein fundamental beam 130 is frequency-converted to output beam 155.

In preferred embodiments, the focal length of lens 132 and the optical spacing of surface-emitting diode laser 210 and external resonator 135 are chosen so that fundamental beam 130 matches the optical mode of external resonator 135. In some such embodiments, the optical length of external resonator 135 is adjusted using a piezo-electric positioner to maximize optical coupling of fundamental beam 130 into the external resonator 135. Other embodiments employ other types of positioners known by those skilled in the art. In this manner, the conversion from the fundamental to the second harmonic (e.g., from 980 nanometers to 490 nanometers) can be optimized. In some embodiments, external resonator 135 is frequency-locked to the optical frequency of fundamental beam 130 using standard frequency-locking techniques such as, but not limited to, the Drever-Hall or Hansch-Couilliard techniques.

Figure 5:
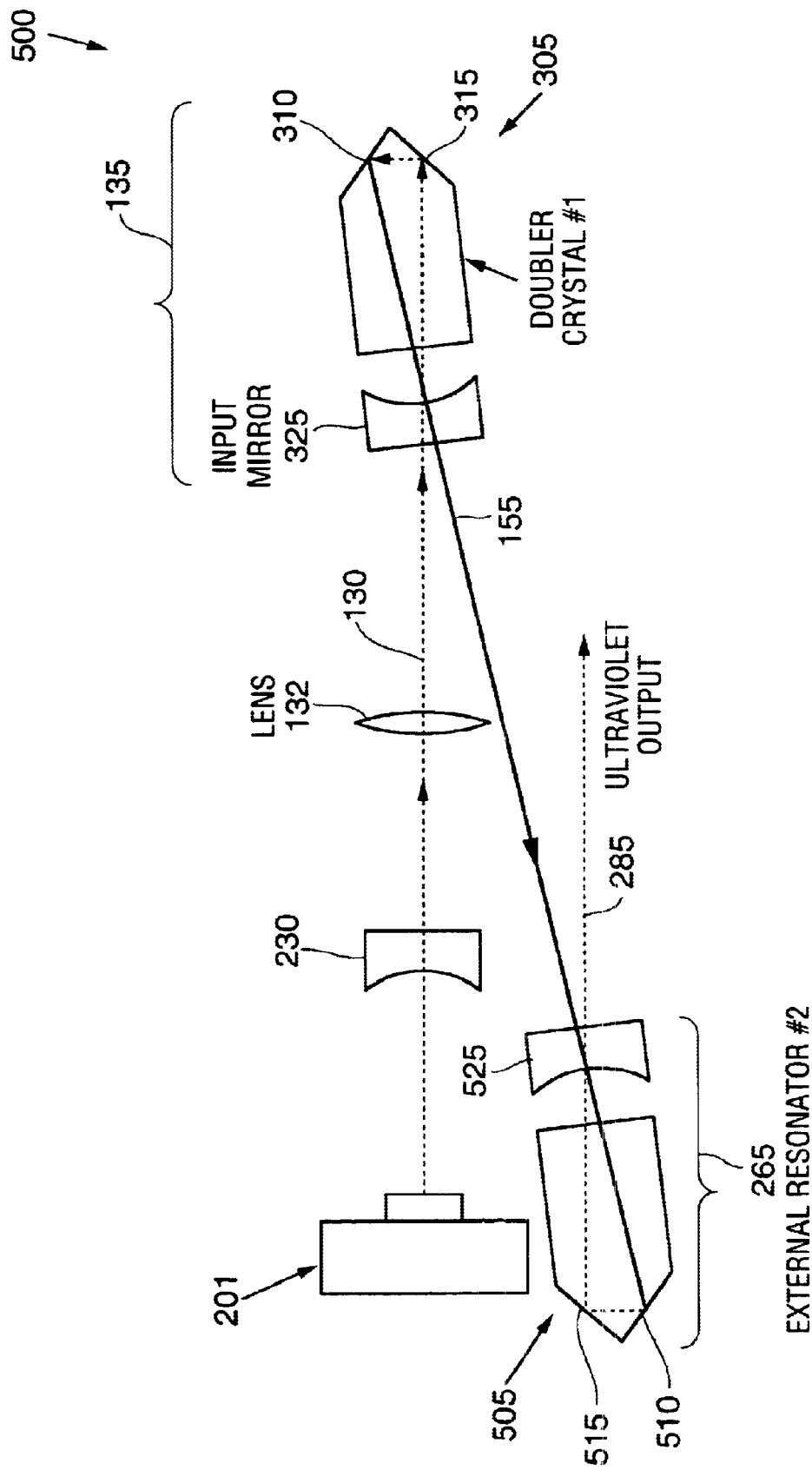
FIG. 5 illustrates two external resonant cavities of the type shown in FIG. 3 for converting the output wavelength of a fundamental beam emitted by a VECSEL.

FIG. 5 illustrates an embodiment of laser device 500 according to the present invention. Laser device 500 includes more than one external resonating cavity for frequency conversion, at least some of which are formed in the manner described with reference to FIG. 3. In the embodiment shown in FIG. 5, laser device 500 includes external resonators 135 and 265.

In this embodiment, surface-emitting diode laser 201 emits fundamental beam 130, which is frequency-doubled in external resonator 135 and emitted as output beam 155. Here, external resonator 135 is configured substantially as described with reference to FIG. 4. In many embodiments, fundamental beam is an infrared beam and output beam is in the visible range.

In the embodiment shown in FIG. 5, external resonator 265 frequency-doubles output beam 155 and emits output beam 285 as a fourth harmonic of fundamental beam 130. In one such embodiment, output beam 155 has a wavelength of approximately 490 nanometers and output beam 285 has a wavelength of approximately 245 nanometers.

Each external resonator is optimized for its individual nonlinear interaction. In some embodiments, nonlinear crystal 305 is preferably LBO or PPKTP for producing blue light. Mirror 325 is coated for a reflectivity of approximately 98% at 980 nanometers and for high transmission at 490 nanometers. In preferred embodiments, the position of mirror 325 is adjusted to frequency-lock external resonator 135 to the frequency of fundamental beam 130.

In some embodiments, output beam 155 has a wavelength of approximately 490 nanometers and is optically coupled into external resonator 265 by an optical device such as a lens (not shown in FIG. 5). In such embodiments, nonlinear crystal 505 is preferably CLBO or β-barium borate for efficiently converting 490 nanometer light to 245 nanometer light. The angles of reflective surfaces 510 and 515 are formed for total internal reflection according to Equation (3), taking into account the refractive index of the material used to form nonlinear crystal 505.

Mirror 525 is formed to have a reflectivity defined by Equation (2) for the wavelength of output beam 155 and to be highly transmissive for the wavelength of output beam 285. In some embodiments, mirror 525 has a reflectivity of approximately 98% for 490 nanometer light. The position of mirror 525 is adjusted to frequency-lock external resonator 265 to the frequency of output beam 155.

While the best mode for practicing the invention has been described in detail, those of skill in the art will recognize that there are numerous alternative designs, embodiments, modifications and applied examples which are within the scope of the present invention. Accordingly, the scope of this invention is not limited to the previously described embodiments.

We claim:

1. A method of operating a solid state laser apparatus, comprising the steps of:

pumping a surface-emitting diode laser to output a fundamental beam having a fundamental wavelength, the surface-emitting diode laser comprising a first resonating cavity;

disposing a first nonlinear crystal in a second resonating cavity external to the first resonating cavity;

directing the fundamental beam into the first nonlinear crystal; and tuning the first nonlinear crystal to generate a first output beam resulting from the interaction of the fundamental beam with the first nonlinear crystal, the first output beam having a first output wavelength different from the fundamental wavelength.

2. The method of claim 1, wherein the pumping step comprises the step of pumping the surface-emitting diode laser with a diode pump laser.

3. The method of claim 1, wherein the pumping step comprises the step of electrically pumping the surface-emitting diode laser.

4. The method of claim 1, further comprising the step of fabricating the first nonlinear crystal to include a first reflective surface, a second reflective surface and an entrance face, wherein the first and second reflective surfaces are configured for total internal reflection and form a portion of the second resonating cavity.

5. The method of claim 1, wherein the tuning step comprises tuning the first nonlinear crystal to operate as an optical parametric oscillator.

6. The method of claim 1, wherein the pumping step comprises the step of establishing a first optical power circulating inside the first resonating cavity, further comprising the step of configuring the second resonating cavity to establish a second optical power circulating inside the second resonating cavity, such that the second optical power is greater than the first optical power.

7. The method of claim 1, further comprising the steps of:

directing the first output beam into a second nonlinear crystal; and tuning the second nonlinear crystal to generate a second output beam, the second output beam having a second output wavelength different from the first output wavelength.

8. The method of claim 7, further comprising the step of disposing the second nonlinear crystal in a third resonating cavity external to the second resonating cavity.

9. The method of claim 7, further comprising the step of disposing the second nonlinear crystal in the second resonating cavity.

10. The method of claim 7, further comprising the steps of:

directing an infrared beam into the second nonlinear crystal; and generating the second output beam by interaction of the infrared beam and the first output beam with the second nonlinear crystal.

11. A method of operating a solid state laser apparatus, comprising the steps of:

pumping a surface-emitting diode laser to output a fundamental beam having a fundamental wavelength, the surface-emitting diode laser comprising a first resonating cavity;

configuring a first surface and a second surface of a nonlinear crystal for total internal reflection to form portions of a second resonating cavity outside of the first resonating cavity;

directing the fundamental beam into the nonlinear crystal; and tuning the nonlinear crystal to generate an output beam resulting from the interaction of the fundamental beam with the nonlinear crystal, the output beam having an output wavelength different from the fundamental wavelength.

12. A laser apparatus comprising:

surface-emitting diode laser means comprising first resonator means;

means for pumping the surface-emitting diode laser means to output a fundamental beam having a fundamental wavelength;

first frequency conversion means disposed external to the first resonator means for converting the fundamental beam to a first output beam having a first output wavelength different from the fundamental wavelength; and means for directing the fundamental beam into the frequency conversion means.

13. The laser apparatus of claim 12, wherein the pumping means comprises a diode pump laser.

14. The laser apparatus of claim 12, wherein the pumping means comprises means for electrically pumping the surface-emitting diode laser.

15. The laser apparatus of claim 12, wherein the first frequency conversion means comprises:

first nonlinear crystal means; and second resonator means.

16. The laser apparatus of claim 15, wherein the first nonlinear crystal means comprises a material selected from the group consisting of lithium niobate, lithium triborate, or potassium titanyl phosphate, β-barium borate, cesium lithium borate, periodically-poled potassium titanyl phosphate, periodic-poled lithium niobate, potassium niobate, potassium titanyl phosphate, rubidium titanyl phosphate, cesium titanyl phosphate, potassium titanyl arsenate and rubidium titanyl arsenate.

17. The laser apparatus of claim 15, wherein the surface-emitting diode laser means develops a first optical power of first resonated light inside the first resonator means, wherein the first frequency conversion means further comprises means for developing a second optical power of second resonated light inside the second resonator means, and wherein the second optical power is greater than the first optical power.

18. The laser apparatus of claim 15, wherein the first nonlinear crystal means comprises a first reflective surface and a second reflective surface, both the first reflective surface and the second reflective surface being configured for total internal reflection and forming portions of the second resonator means.

19. The laser apparatus of claim 15, wherein a first surface of the first nonlinear crystal means comprises a reflective coating which forms a portion of the second resonating cavity.

20. The laser apparatus of claim 12, wherein the first frequency conversion means comprises an optical parametric oscillator.

21. The laser apparatus of claim 12, further comprising second frequency conversion means for generating a second output beam having a wavelength different from the first output wavelength.

22. The laser apparatus of claim 21, wherein the second frequency conversion means comprises:

second nonlinear crystal means; and third resonator means external to the second resonator means.

23. The laser apparatus of claim 22, further comprising:

means for outputting an infrared laser beam; and means for directing the infrared laser beam into the second frequency conversion means, wherein the second frequency conversion means generates the second output beam by interaction of the infrared laser beam and the first output beam with the second nonlinear crystal means.

24. The laser apparatus of claim 21, wherein the second frequency conversion means comprises second nonlinear crystal means and wherein the second nonlinear crystal means is disposed in the second resonator means.

25. A solid state laser apparatus, comprising:

a surface-emitting diode laser which outputs a fundamental beam having a fundamental wavelength, the surface-emitting diode laser comprising a first resonating cavity;

a nonlinear crystal comprising a first surface and a second surface configured to form portions of a second resonating cavity outside of the first resonating cavity;

an optical device for directing the fundamental beam into the nonlinear crystal; and an adjustable mount for angle-tuning the nonlinear crystal to generate an output beam resulting from the interaction of the fundamental beam with the nonlinear crystal, the output beam having an output wavelength different from the fundamental wavelength.

* * * * *